United States Patent
Saito

(10) Patent No.: US 10,691,634 B2
(45) Date of Patent: *Jun. 23, 2020

(54) DIE AND PACKAGE

(71) Applicant: PEZY Computing K.K., Tokyo (JP)

(72) Inventor: Motoaki Saito, Tokyo (JP)

(73) Assignee: PEZY COMPUTING K.K., Chiyoda-Ku, Tokyo (JP)

( * ) Notice: Subject to any disclaimer, the term of this patent is extended or adjusted under 35 U.S.C. 154(b) by 23 days.

This patent is subject to a terminal disclaimer.

(21) Appl. No.: 15/780,070

(22) PCT Filed: Nov. 30, 2015

(86) PCT No.: PCT/JP2015/083670
§ 371 (c)(1),
(2) Date: May 30, 2018

(87) PCT Pub. No.: WO2017/094092
PCT Pub. Date: Jun. 8, 2017

(65) Prior Publication Data
US 2018/0365192 A1     Dec. 20, 2018

(51) Int. Cl.
*G06F 15/80* (2006.01)
*H01L 27/04* (2006.01)
(Continued)

(52) U.S. Cl.
CPC ............ *G06F 15/803* (2013.01); *G06F 15/17* (2013.01); *G06F 15/78* (2013.01); *G11C 5/04* (2013.01);
(Continued)

(58) Field of Classification Search
CPC ........ G06F 15/803; G06F 15/78; G06F 15/17; H01L 27/10897; H01L 27/10844;
(Continued)

(56) References Cited

U.S. PATENT DOCUMENTS 7,472,051 B2   12/2008   Mariani et al.
8,250,548 B2    8/2012   Kasahara et al.
(Continued)

FOREIGN PATENT DOCUMENTS

JP   S56-018439 A    2/1981
JP   H05-190758 A    7/1993
JP   2011-108140 A   6/2011

OTHER PUBLICATIONS

Hiroshige Goto, "Future to be brought by the change s from ATI GPUs Move Toward Multi-Dies", DOS/V Power Report, Impress Corporation., pp. 188-192, Jan. 1, 2008, vol. 18, No. 1.
(Continued)

*Primary Examiner* — Ajay Ojha
(74) *Attorney, Agent, or Firm* — Muncy, Geissler, Olds & Lowe, P.C.

(57) ABSTRACT

Provided efficiently and at low cost are: a package for core number ratios appropriate for all types of computers; and dies included in the package.
This package includes at least one die provided with: at least one of a first core formed of a CPU core or a latency core and a second core formed of an accelerator core or a throughput core; an external interface; memory interfaces 24 to 26; and a die interface 23 which is connected to another die.
The die includes a first type die and a second type die each including both the first core and the second core and the core number ratio between the first core and the second core in the first type die differs from that in the second type die.
Moreover, the memory interfaces include an interface conforming to TCI.
In addition, the memory interfaces further include an interface conforming to HBM.

15 Claims, 9 Drawing Sheets

(51) Int. Cl.
*H01L 21/822* (2006.01)
*G06F 15/17* (2006.01)
*G06F 15/78* (2006.01)
*H01L 21/82* (2006.01)
*G11C 5/04* (2006.01)
*H01L 27/108* (2006.01)

(52) U.S. Cl.
CPC ............ *H01L 21/82* (2013.01); *H01L 21/822* (2013.01); *H01L 27/04* (2013.01); *H01L 27/10844* (2013.01); *H01L 27/10897* (2013.01)

(58) Field of Classification Search
CPC ....... H01L 27/04; H01L 21/822; H01L 21/82; G11C 5/04
See application file for complete search history.

(56) References Cited

U.S. PATENT DOCUMENTS

| | | | |
|---|---|---|---|
| 8,407,505 | B2 | 3/2013 | Asaba |
| 8,719,547 | B2 | 5/2014 | Chinya et al. |
| 9,032,099 | B1 | 5/2015 | Parra et al. |
| 9,129,158 | B1 | 9/2015 | Medasani et al. |
| 9,432,298 | B1* | 8/2016 | Smith ................. H04L 49/9057 |
| 9,495,498 | B2 | 11/2016 | Bartley et al. |
| 10,091,295 | B1 | 10/2018 | Savic et al. |
| 10,120,691 | B2 | 11/2018 | Ginzburg et al. |
| 2013/0141442 | A1 | 6/2013 | Brothers et al. |
| 2014/0176187 | A1* | 6/2014 | Jayasena ............ H03K 19/1776 326/39 |
| 2016/0335215 | A1 | 11/2016 | Biran et al. |

OTHER PUBLICATIONS

Noriyuki Miura et al. "A 1 Tb/s 1 pJ/b 6.4mm2/TB/s QDR Inductive-Coupling Interface Between 65-nm CMOS Logic and Emulated 100-nm DRAM", IEEE Journal on Emerging and Selected Topics in Circuits and Systems, IEEE, pp. 249-256, Jun. 7, 2012, vol. 2.

Asakawa Naoki, "Data Analysis Infrastructure Geared for HPC: Next Generation Core Technology Watched by Google and IBM", Nikkei Computer, Nikkei Business Publications, Inc., pp. 58-63, Jul. 24, 2014, No. 865.

International Preliminary Report on Patentability English language translation of corresponding PCT Application PCT/JP2015/083669, dated Jun. 14, 2018, 11 pages.

Kuroda. ThruChip interface (TCI) for 3D networks on chip. 2011 IEEE/IFIP 19th International Conference on VLSI and System-On-Chip. Oct. 3, 2011. pp. 238-241.

Zou et al. "Heterogeneous architecture design with emerging 3D and non-volatile memory technologies". The 20th Asia and South Pacific Design Automation Conference. Jan. 19, 2015. pp. 785-790.

Miura et al. "A scalable 3D heterogeneous multi-core processor with inductive-coupling thruchip interface". COOL CHIPS XVI (COOL CHIPS), 2013 IEEE. Apr. 17, 2013. pp. 1-3.

EPO. Supplementary European Search Report issued in the EP Patent Application No. EP15909722.9. dated Nov. 26, 2018. 6 pages.

EPO. Office Action issued in the EP Patent Application No. EP15909722. 9. dated Dec. 13, 2018. 8 pages.

Office Action issued in U.S. Appl. No. 15/780,061, dated Sep. 9, 2019.

Supplementary European Search Report issued in EP Patent Application No. EP15909721.1, dated Nov. 26, 2018.

Office Action issued in the EP Patent Application No. EP15909721. 1, dated Dec. 19, 2018.

Notification of Reasons for Refusal issued in JP Patent Application No. JP2016-517011, dated May 10, 2016.

International Preliminary Report on Patentability for International Application No. PCT/JP2015/083669 dated Jun. 14, 2018.

Office Action issued in the related U.S. Appl. No. 15/780,061, dated Feb. 14, 2020; pp. 1-6.

* cited by examiner

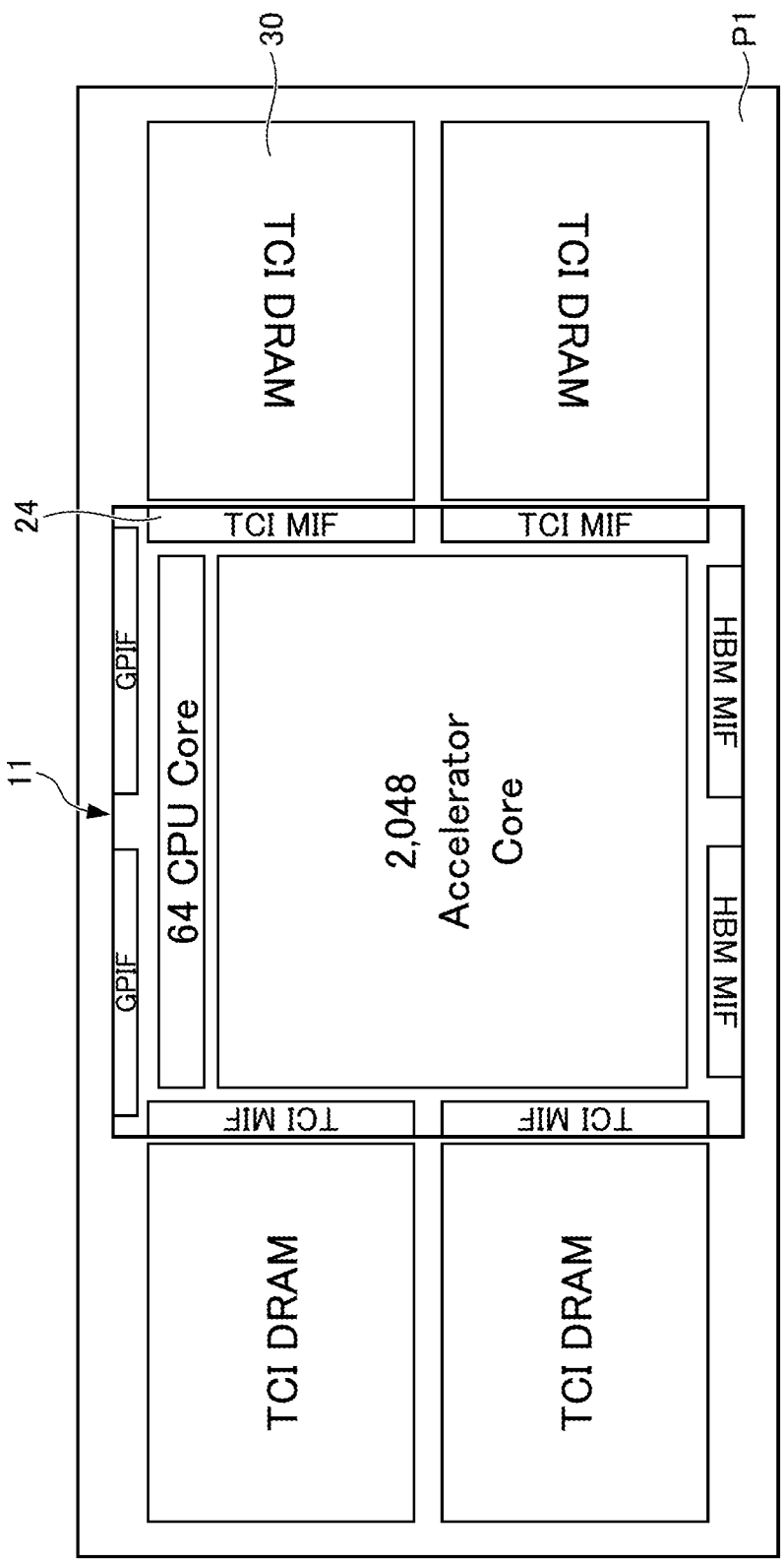

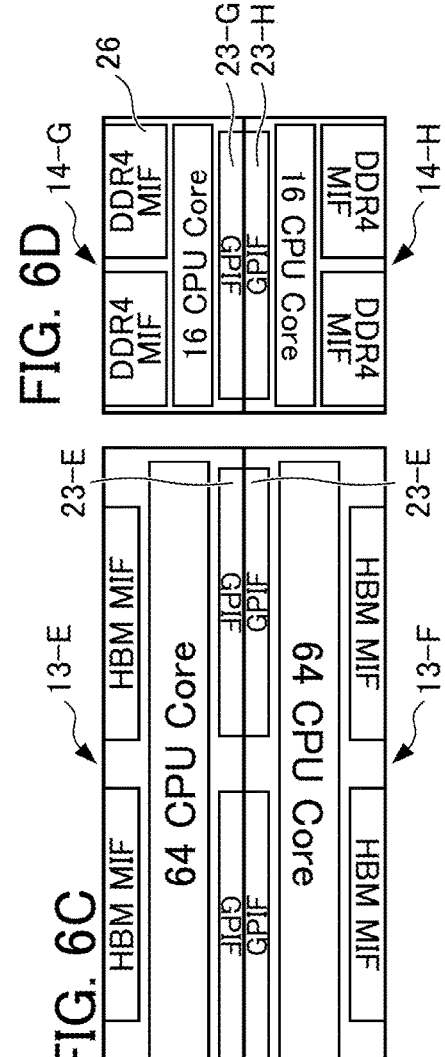
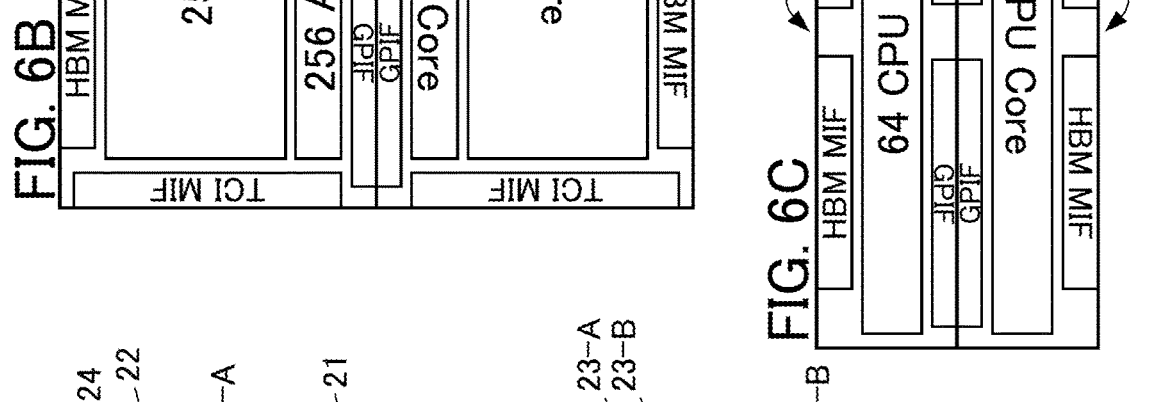
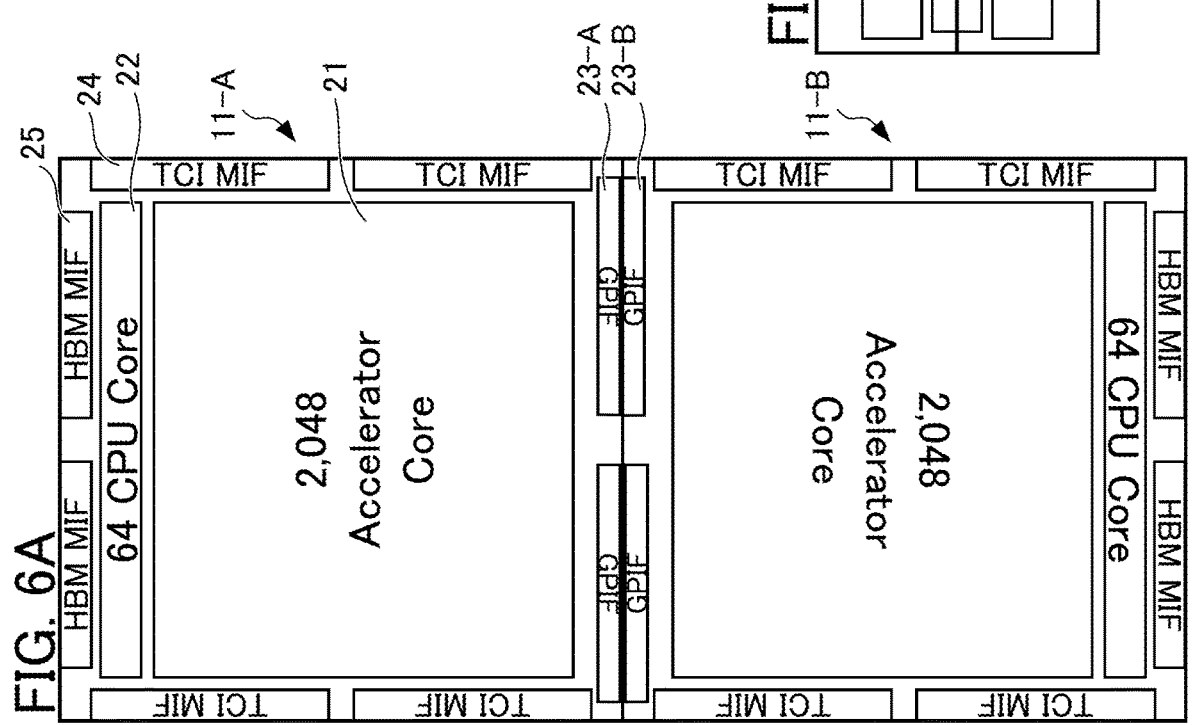

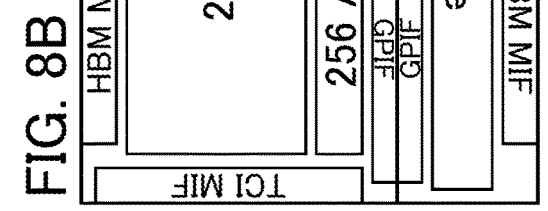
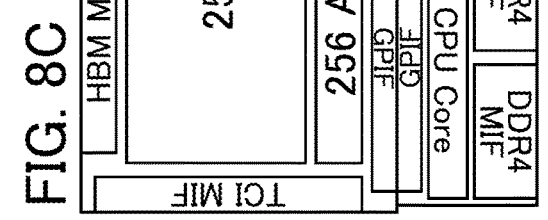
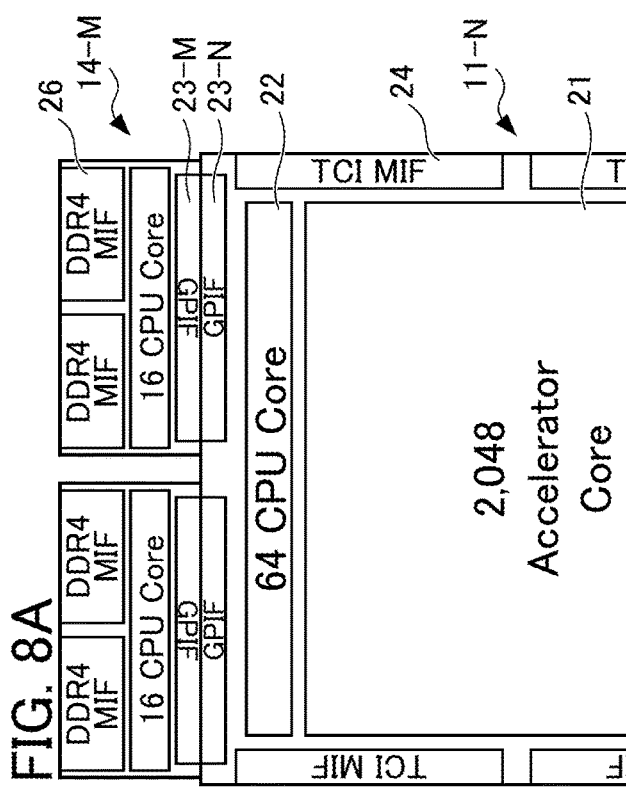
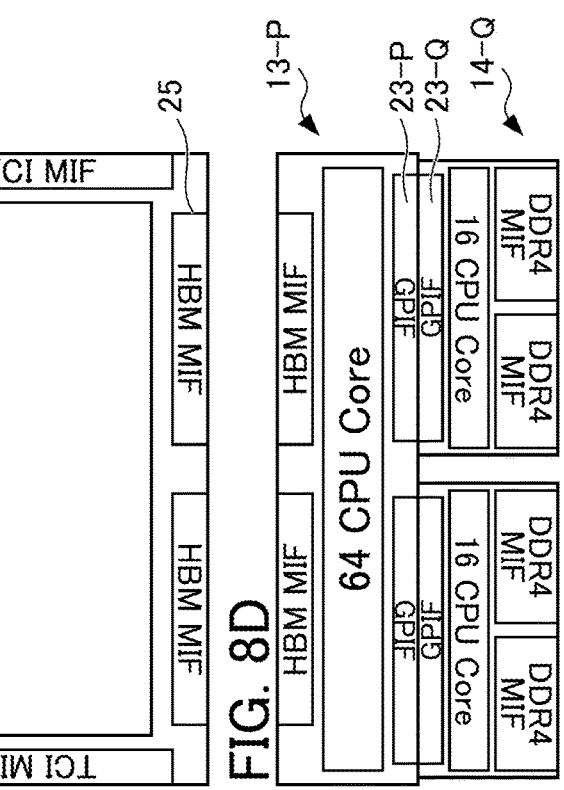

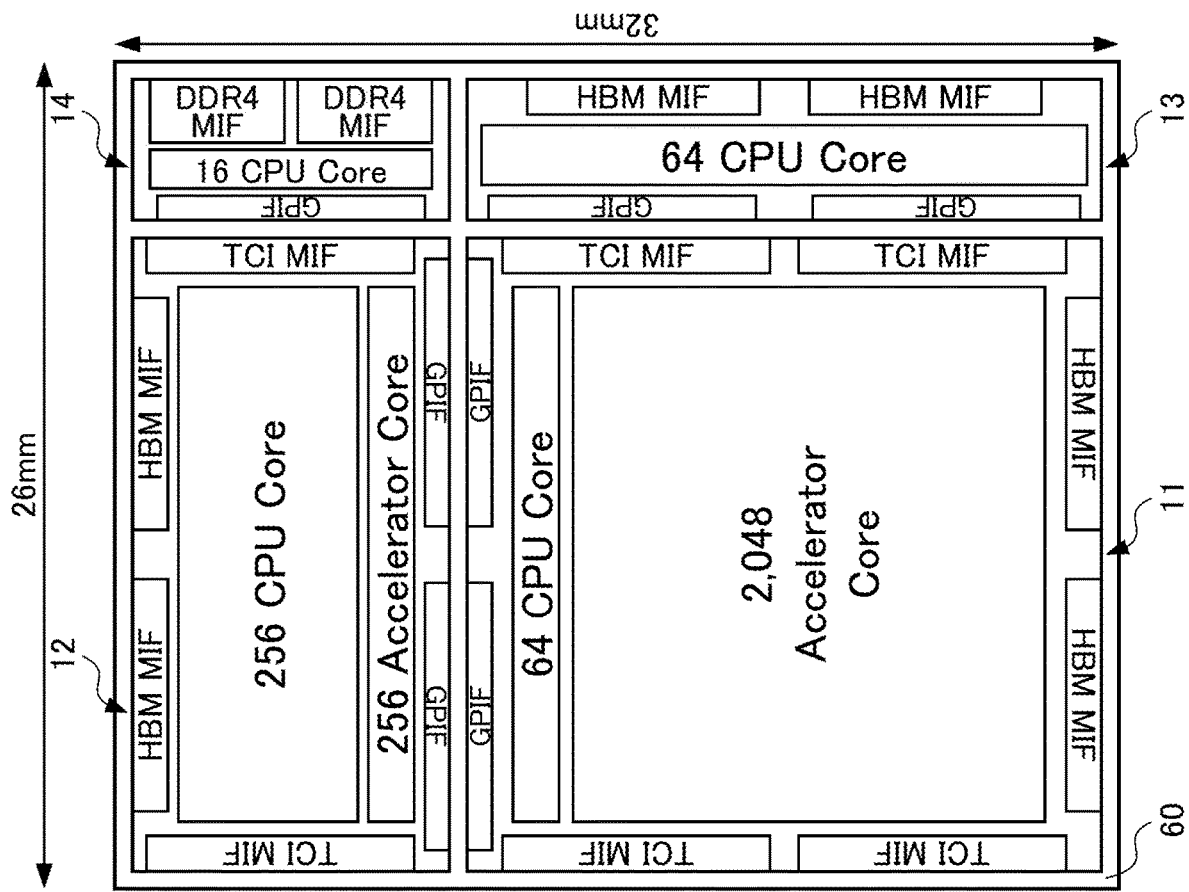
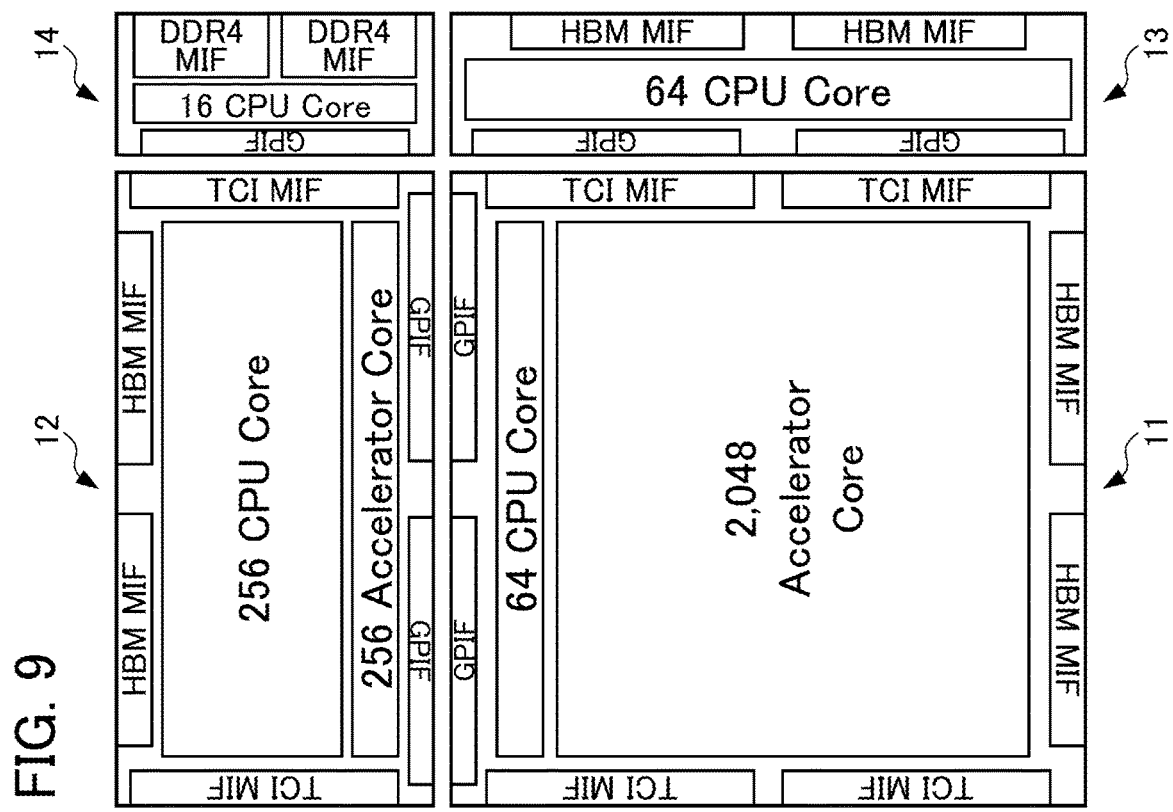
FIG. 9

DIE AND PACKAGE

TECHNICAL FIELD

The present invention relates to a die and a package.

BACKGROUND ART

Conventionally, there are various types of computers on which packages using an accelerator core or a throughput core and a CPU core (central processing unit core) or a latency core are mounted (refer to Patent Document 1).

That is, conventionally, in view of the respective characteristics of the accelerator core or the throughput core and the CPU core or the latency core, packages according to the use purposes of various types of computers are manufactured.

Patent Document 1: Japanese Unexamined Patent Application, Publication No. 2011-108140

DISCLOSURE OF THE INVENTION

Problems to be Solved by the Invention

However, because a core number ratio between the accelerator core and the CPU core varies depending on the application requirements, the core number ratio varies depending on the types of computers often developed according to main applications. Therefore, dies and packages with different core number ratios for every type of computers are manufactured, so that cost is high and efficiency is low.

An object of the present invention is to provide a package for core number ratios appropriate for all types of computers and a set of dies included in the package, efficiently at low cost.

Means for Solving the Problems

To achieve the above object, in dies and a package according to an aspect of the present invention, each die in a set of dies includes at least one of a first core including a CPU core or a latency core and a second core including an accelerator core or a throughput core, an external interface, memory interfaces, and a die interface connected to another die.

The memory interfaces include at least one memory interface that can connect a memory conforming to a predetermined specification.

The memory interfaces include an interface conforming to specifications for performing communication in an electrically non-contact manner.

The memory interfaces further include an interface conforming to TCI.

The memory interfaces further include an interface conforming to a three-dimensional stacked next-generation high-speed memory that performs communication in an electrically contact manner.

The memory interfaces further include an interface conforming to HBM.

The memory interfaces further include an interface conforming to a general-purpose memory performing communication in an electrically contact manner and a DIMN (dual inline memory module).

The memory interfaces further include an interface conforming to DDR4.

The package includes at least one set of dies.

The package further includes the first type die and memories connected to the memory interfaces of the first type die.

The first type memory interfaces include an interface conforming to specifications for performing communication in an electrically non-contact manner.

The first type memory interfaces further include an interface conforming to TCI.

The first type memory interfaces further include an interface conforming to a three-dimensional stacked next-generation high-speed memory that performs communication in an electrically contact manner.

The first type memory interfaces further include an interface conforming to HBM.

The package further includes a second type die including the memory interfaces conforming to a general-purpose memory performing communication in an electrically contact manner and a DINM (dual inline memory module), and the first type die and the second type die are mutually connected by the respective die interfaces.

Effects of the Invention

According to the present invention, it is possible to provide dies and a package for all types of computers, efficiently at low cost.

BRIEF DESCRIPTION OF THE DRAWINGS

FIG. 2 is a diagram showing an example of a large package for high-speed memory communication of a main die in the set of dies of FIG. 1.

FIGS. 6A to 6D are diagrams showing an example in which the same types of dies are mutually connected using GPIF.

FIGS. 8A to 8D are diagrams showing an example in which different types of dies of different numbers are mutually connected using GPIF.

FIG. 9 is a diagram showing the case where a set of four types of dies is manufactured using one exposure mask.

PREFERRED MODE FOR CARRYING OUT THE INVENTION

In description of the present specification, "performing communication in a non-contact manner" means that one communication unit performing the communication and other communication unit performing the communication perform the communication without coming into contact with each other and using a conductive member (at least one of a solder, conductive adhesive, and a wire).

In addition, "performing the communication in a contact manner" means that one communication unit performing the communication and a communication unit performing the communication perform the communication while being in contact with each other or perform the communication using a conductive member (at least one of a solder, a conductive adhesive, and a wire).

In addition, the communication unit is a concept including a portion performing transmission and reception, a portion performing only the transmission, and a portion performing only the reception.

FIG. 1 is a diagram showing a configuration example of a set of dies according to an embodiment of the present invention.

In the example of FIG. 1, a set of dies is configured to include a main die 11, a sub-die 12, a sub-die 13, and a memory interface die 14.

Figure 1A:
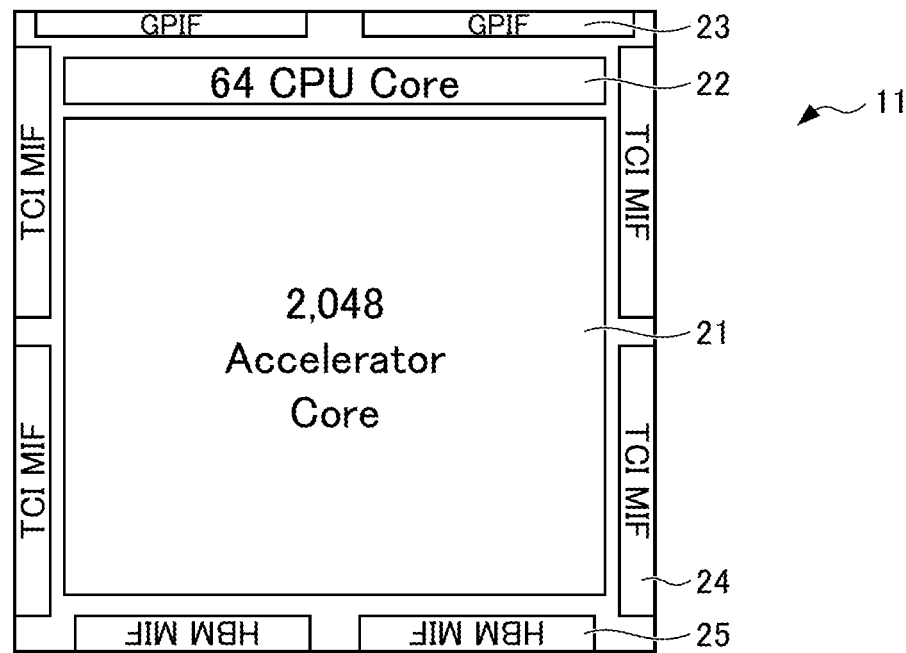
FIGS. 1A and 1D are diagrams showing a configuration example of a set of dies according to an embodiment of the present invention.

FIG. 1A shows a configuration of the main die 11.

The main die 11 includes an accelerator core 21, a CPU core 22, GPIF (general purpose interfaces) 23, TCI/MIF (thru chip interfaces/memory interfaces) 24, and high bandwidth memory/memory interfaces (HBM/MIF) 25.

Here, the accelerator core 21 is a core taking a small many-core configuration capable of obtaining a large amount of operation results. The accelerator core 21 is large in terms of latency (delay time from requesting data transfer to a device to returning a result thereof), but has a property of high throughput (an amount of data that can be processed by a computer or a network within a certain time).

The CPU core 22 is a large core that manages execution of an OS (operating system), network control/load adjustment, accelerator control/load distribution adjustment, and the like and performs complicated operation processing with low latency.

In addition, in the drawing of FIG. 1 or the like, the numbers "2048" and "64" respectively described in the accelerator core 21 and the CPU core 22 indicate the number of cores of the accelerator core 21 and the CPU core 22, respectively.

The GPIF 23 is a general-purpose die interface connected to another die.

The TCI/MIF 24 is a memory interface that communicates with the memory in a non-contact manner by wireless communication between adjacent dies using magnetic field coupling.

The TCI has advantages of enabling high-speed communication while maintaining low power consumption, impedance matching being unnecessary because it is in an electrically non-contact state, and being no influence on yield because an antenna necessary for magnetic field coupling can be formed in a wafer in a previous process and subsequent process work does not increase, as compared with an existing wired communication method.

The HBM/MIF 25 is a wide-band memory interface of a TB/sec class.

Although not shown in the drawings, various dies including the main die are provided with an external interface such as a PCI express.

Figure 1B:
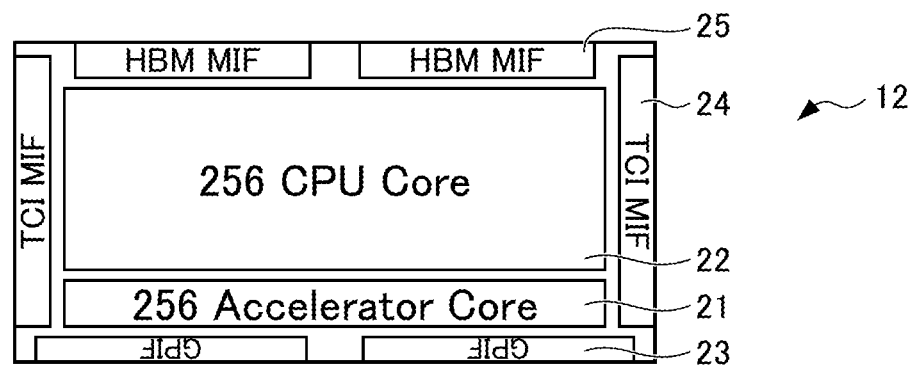

FIG. 1B shows a configuration of the sub-die 12.

Similar to the main core 11, the sub-die 12 includes an accelerator core 21, a CPU core 22, GPIFs 23, TCI/MIFs 24, and HBM/MIFs 25.

As such, components of the sub-die 12 of FIG. 1B itself are the same as those of the main die 11 of FIG. 1A.

However, a core number ratio between the accelerator core 21 and the CPU core 22 is 2048:64 in the main die 21, while it is 256:256 in the sub-die 12.

In addition, the number of TCI/MIFs 24 is four in the main die 21, while it is two in sub-die 12.

Figure 1C:
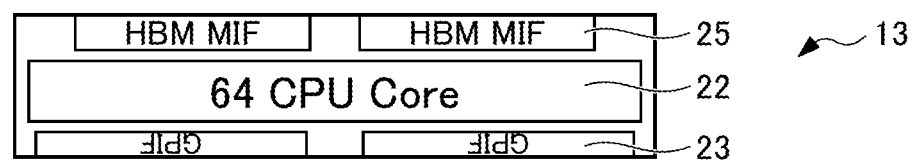

FIG. 1C shows a configuration of the sub-die 13.

The sub-die 13 includes a CPU core 22, GPIFs 23, and HBM/MIFs 25.

In the sub-die 13, the number of cores of the CPU core 22 is 64, and the accelerator core 21 does not exist.

In other words, a core number ratio between the accelerator core 21 and the CPU core 22 in the sub-die 13 of FIG. 1C is 0:64 and is different from a core number ratio in the main core 11 of FIG. 1A and a core number ratio in the sub-core 12 of FIG. 1B.

In addition, the sub-die 13 is different from the main core 11 and the sub-core 12 in that the TCI/MIF 24 does not exist (0).

Figure 1D:
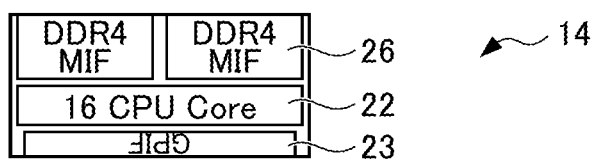

FIG. 1D shows a configuration of the memory interface die 14.

The memory interface die 14 includes a CPU core 22, a GPIF 23, and DDR4/MIFs (double data rate 4/memory interfaces) 26.

The DDR4/MIF 26 is a memory interface conforming to a DDR4 SDRAM (double-data-rate4 synchronous dynamic random access memory) and corresponds to both a memory unit body and a DIMM (dual inline memory module).

DDR4 is a type of standard of a DRAM (dynamic random access memory) that is formed of a semiconductor integrated circuit.

The four types of dies included in the set of dies are designed to have different sizes for the purpose of making the best use of an exposure mask 60 (refer to FIG. 9) of a size of 26 mm×32 mm without gaps.

A package is generated by connecting an arbitrary number of dies of an arbitrary type and an arbitrary number of memories of an arbitrary type from the four types of independent dies.

Here, the package means a package obtained by packaging dies and a set of memories connected to the dies with ceramic or molding resin to suppress damage or impacts on the dies and the memories connected to the dies.

After generating the package, individual semiconductor products are cut/separated from a lead frame by a mold and an external lead is formed into a predetermined shape.

Then, necessary tests are performed, a product name or the like is printed on a surface of the semiconductor product, and a semiconductor is completed.

The completed semiconductor is mounted on various types of computers.

In the total core number of the accelerator core 21 and the CPU core 22 or a core number ratio thereof, optimal values vary depending on the types of computers.

On the other hand, different types of independent dies different in the number of cores or the core number ratio are mutually connected or the same types of dies are connected, so that it is possible to provide packages for ratios or core numbers appropriate for all computers without individually manufacturing packages according to the types of computers.

Hereinafter, concrete examples of packages by connection of various dies and various memories will be described with reference to FIGS. 2 to 8.

FIG. 2 is a diagram showing an example of a large package for high-speed memory communication.

A package P1 of FIG. 2 is configured to include a main die 11 and TCI DRAMs 30 connected to TCI/MIFs 24 of the main die 11.

In the example of FIG. 2, the TCI DRAMs 30, being four large memories, are connected to the four TCI/MIFs 24 of the main die 11, respectively.

As described above, by applying the package P1 in which the main die 11 and the TCI DRAMs 30 are connected in a non-contact manner by the TCI/MIFs 24, high-speed and large-capacity memory communication can be realized.

Figure 3:
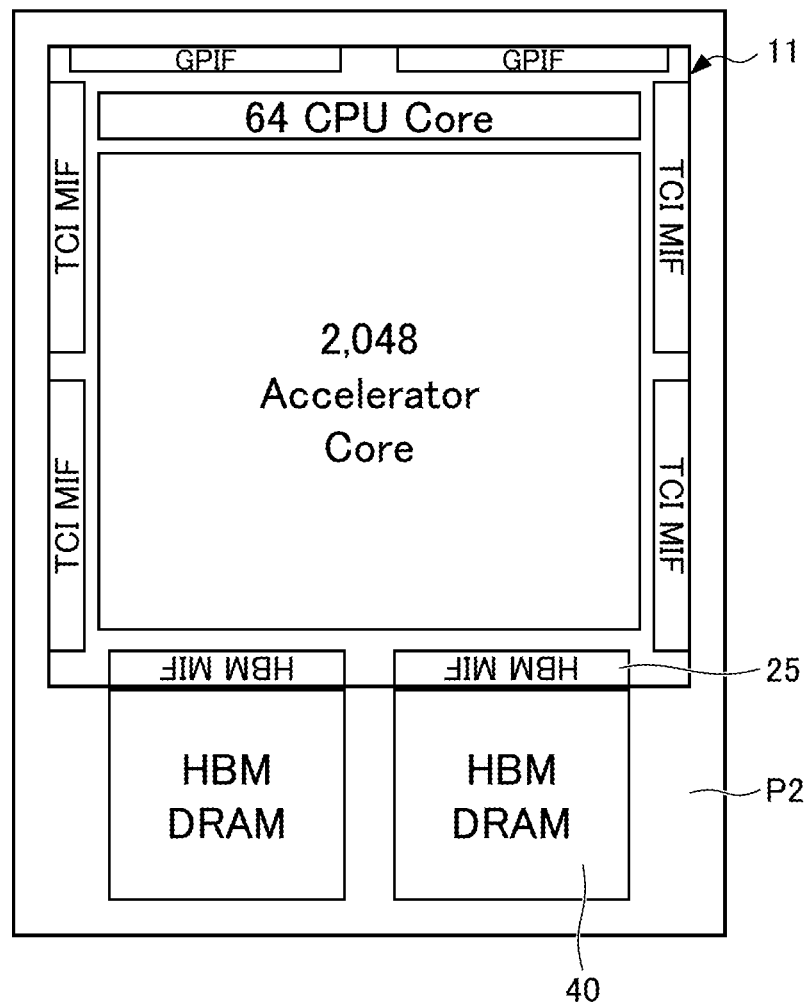
FIG. 3 is a diagram showing an example of a small package for a main die.

FIG. 3 is a diagram showing an example of a small package for the main die 11.

A package P2 of FIG. 3 is configured to include a main die 11 and HBM DRAMs 40 connected to HBM/MIFs 25 of the main die 11.

In the example of FIG. 3, the HBM DRAMs 40, being two small memories, are connected to the two HBM/MIFs 25 of the main die 11, respectively.

As described above, by applying the package P2 in which the main die 11 and the HBM DRAMs 40 are connected by the HBM/MIFs 24, miniaturization of the package and wide-band memory communication can be realized.

Figure 4:
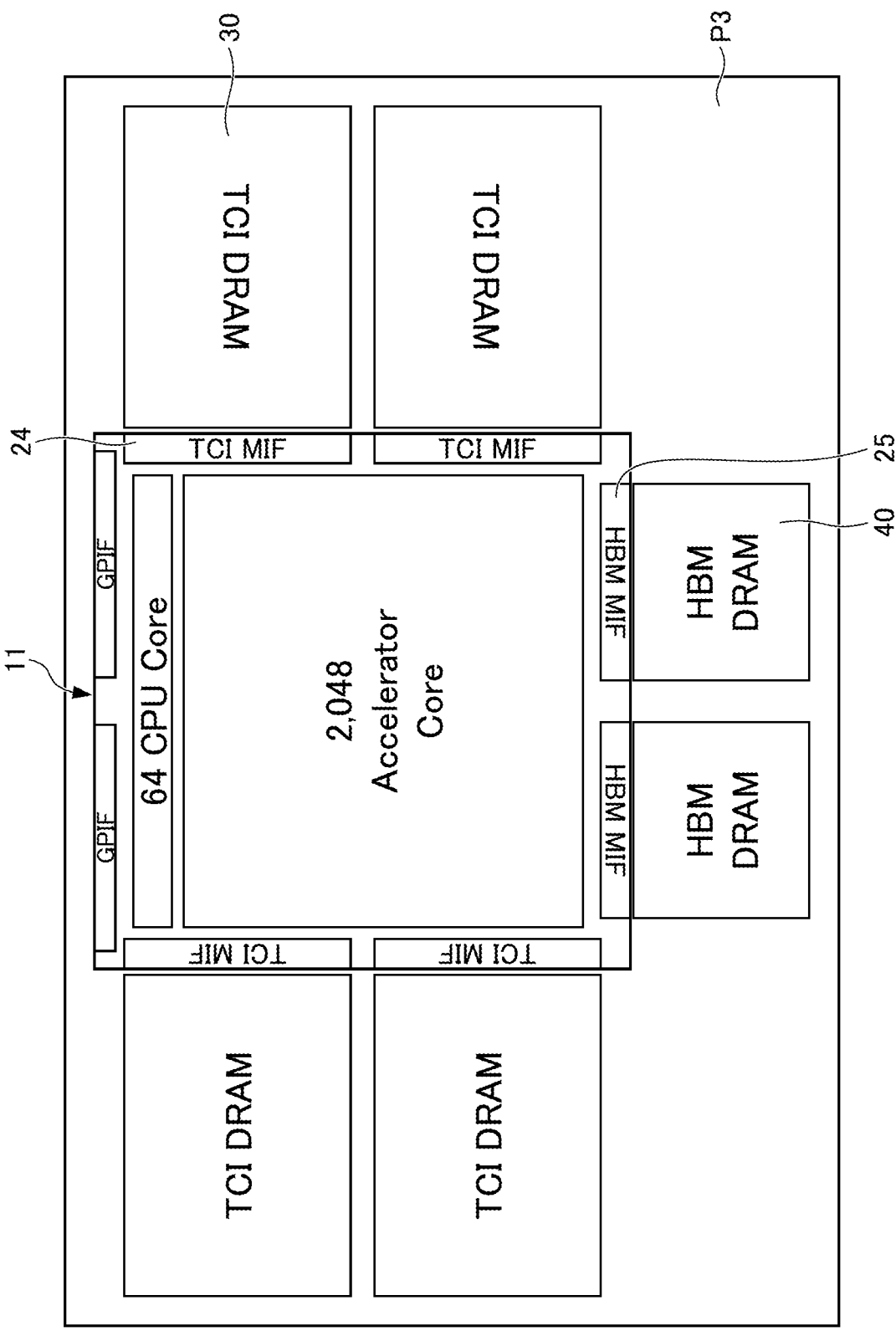
FIG. 4 is a diagram showing an example of a large package for high-speed memory communication in which a main die and a plurality of types of memories are connected.

FIG. 4 is a diagram showing an example of a large package for high-speed memory communication in which the main die 11 and a plurality of types of memories are connected.

A package P3 of FIG. 4 is configured to include a main die 11, TCI DRAMs 30 connected to TCI/MIFs 24 of the main die 11, and HBM DRAMs 40 connected to HBM/MIFs 25 of the main die 11.

In the example of FIG. 4, the TCI DRAMs 30, being four large memories, are connected to the four TCI/MIFs 24 of the main die 11, respectively.

In addition, the two HBM DRAMs 40 are connected to the two HBM/MIFs 25 of the main die 11, respectively.

As described above, by applying the package P3 in which the main die 11 and the TCI DRAMs 30 are connected by the TCI/MIFs 24 and the main die 11 and the HBM DRAMs 40 are connected by the HBM/MIFs 25, high-speed and large-capacity wide-band memory communication that makes the most of the respective characteristics of a plurality of types of memories can be realized.

Figure 5:
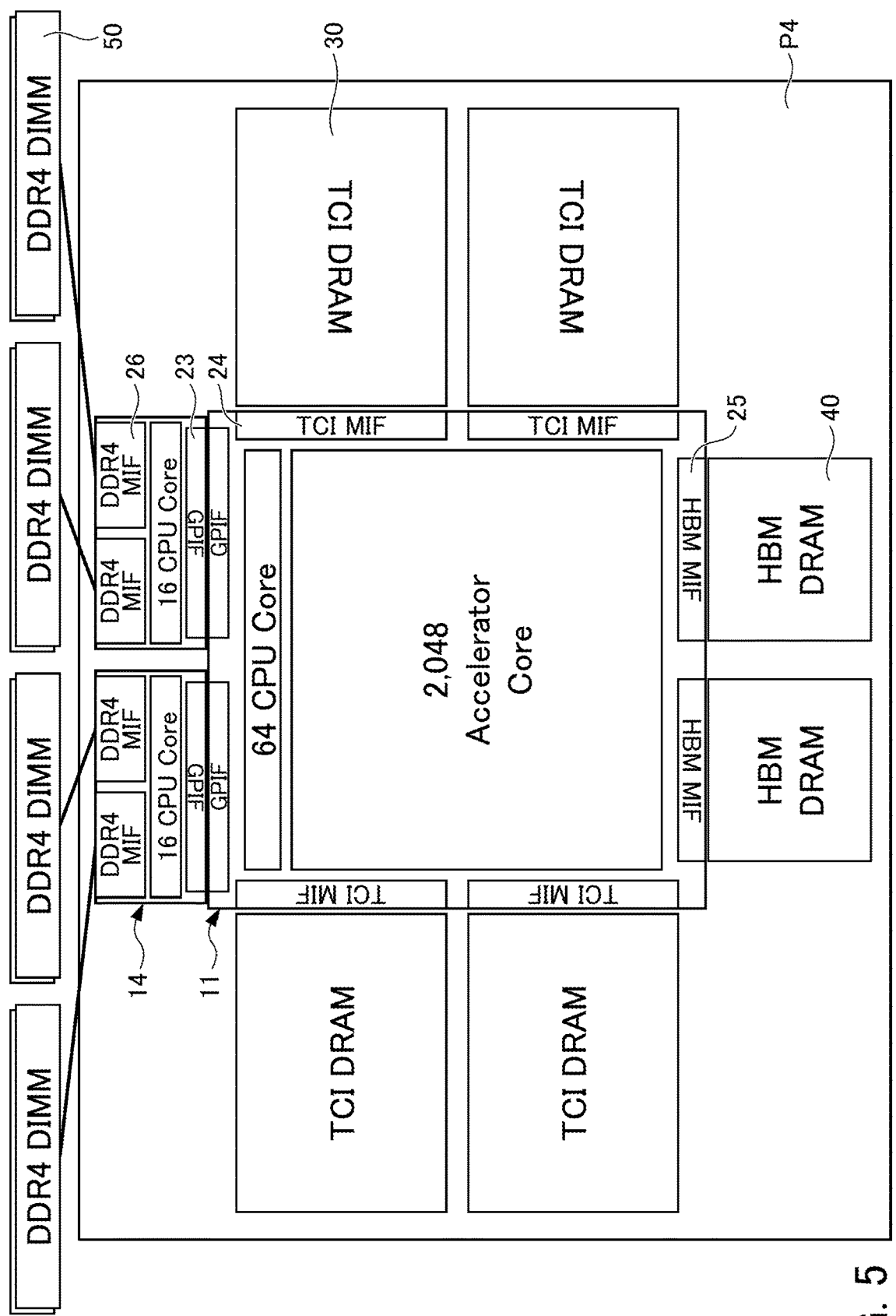
FIG. 5 is a diagram showing an example of a package of a maximum configuration in which a main die and a plurality of types of memories are connected.

FIG. 5 is a diagram showing an example of a package of the maximum configuration in which the main die 11 and a plurality of types of memories are connected.

A package P4 of FIG. 5 is configured to include a main die 11, ICI DRAMs 30 connected to TCI/MIFs 24 of the main die 11, HBM DRAMs 40 connected to HBM/MIFs 25 of the main die 11, and memory interface dies 14 connected to GPIFs 23 of the main die 11.

In addition, the memory interface die 14 includes DDR4/MIFs 26.

The DDR4/MIF 26 is connected to a DDR4 DIMM 50, which is a memory module at the outside of the package P4.

In the example of FIG. 5, the TCI DRAMs 30, being four large memories, are connected to the four TCI/MIFs 24 of the main die 11, respectively.

In addition, the two HBM DRAMs 40 are connected to the two HBM/MIFs 25 of the main die 11, respectively.

Furthermore, a plurality of DDR4 DIMMs 50 are connected to each of the memory interface dies 14 connected to the two GPIFs 23 of the main die 11.

As described above, by applying the package P4 in which the main die 11 and the TCI DRAMs 30 are connected by the TCI/MIFs 24, the main die 11 and the HBM DRAMs 40 are connected by the HBM/MIFs 25, and the main die 11, the memory interface dies 14, and the DDR4 DIMMs 50 are connected by the GPIFs 23, the HBM/MIFs 25, and the DDR4/MIFs 26, maximization of a memory capacity of the main die 11 can be realized.

FIGS. 6A to 6D are diagrams showing an example in which the same types of dies are mutually connected using the GPIFs 23.

In an example of FIG. 6A, a main die 11-A and a main die 11-B are mutually connected using GPIFs 23-A and GPIFs 23-B.

The two GPIFs 23-B of the main die 11-B are connected to the two GPIFs 23-A of the main die 11-A, respectively.

In both the main die 11-A and the main die 11-B, the number of cores of the CPU core 22 is 64 and the number of cores of the accelerator core 21 is 2048.

In other words, a core number ratio between the accelerator core 21 and the CPU core 22 after connection of the main die 11-A and the main die 11-B of FIG. 6A is 4096:128.

As described above, by connecting the main die 11-A and the main die 11-B, it is possible to increase the total number of cores of the main die 11-A and the main die 11-B connected while maintaining the core number ratio between the accelerator core 21 and the CPU core 22.

In an example of FIG. 6B, a sub-die 12-C and a sub-die 12-D are mutually connected by GPIFs 23-C and GPIFs 23-D.

The two GPIFs 23-D of the sub-die 12-D are connected to the two GPIFs 23-C of the sub-die 12-C, respectively.

In both the sub-die 12-C and the sub-die 12-D, the number of cores of the CPU core 22 and the number of cores of the accelerator core 21 are 256.

In other words, a core number ratio between the accelerator core 21 and the CPU core 22 after connection of the sub-die 12-C and the sub-die 12-D of FIG. 6B is 512:512.

As described above, by connecting the sub-die 12-C and the sub-die 12-D, it is possible to increase the total number of cores of the sub-die 12-C and the sub-die 12-D connected while the core number ratio between the accelerator core 21 and the CPU core 22 is maintained, similar to the case of FIG. 6A.

In an example of FIG. 6C, a sub-die 13-E and a sub-die 13-F are mutually connected using GPIFs 23-E and GPIFs 23-F.

The two GPIFs 23-F of the sub-die 13-F are connected to the two GPIFs 23-E of the sub-die 13-E, respectively.

In both the sub-die 13-E and the sub-die 13-F, the number of cores of the CPU core 22 is 64 and there is no accelerator core.

In other words, a core number ratio between the accelerator core 21 and the CPU core 22 after connection of the sub-die 13-E and the sub-die 13-F of FIG. 6C is 0:128.

As described above, by connecting the sub-die 13-E and the sub-die 13-F, it is possible to increase the total number of cores of the sub-die 13-E and the sub-die 13-F connected.

In an example of FIG. 6D, a memory interface die 14-G and a memory interface die 14-H are mutually connected by GPIFs 23-G and GPIFs 23-H.

The two GPIFs 23-H of the memory interface die 14-H are connected to the two GPIFs 23-G of the memory interface die 14-G, respectively.

In both the memory interface die 14-G and the memory interface die 14-H, the number of cores of the CPU core 22 is 16 and there is no accelerator core.

In other words, a core number ratio between the accelerator core 21 and the CPU core 22 after connection of the memory interface die 14-G and the memory interface die 14-H of FIG. 6D is 0:32.

Figure 7A:
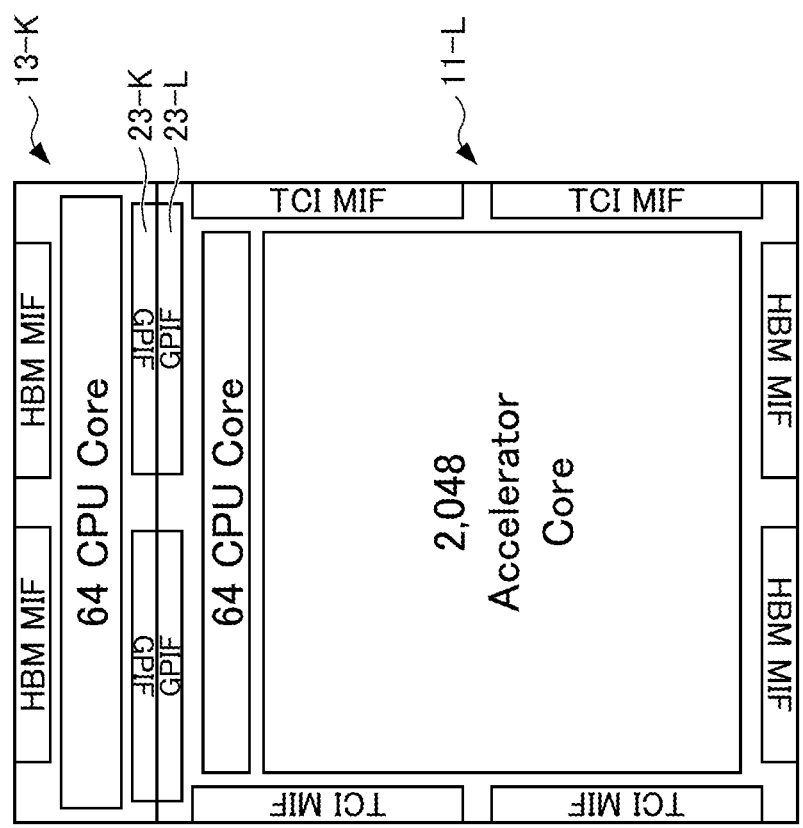
FIGS. 7A and 7B are diagrams showing an example in which different types of dies are mutually connected using GPIF.
Figure 7B:
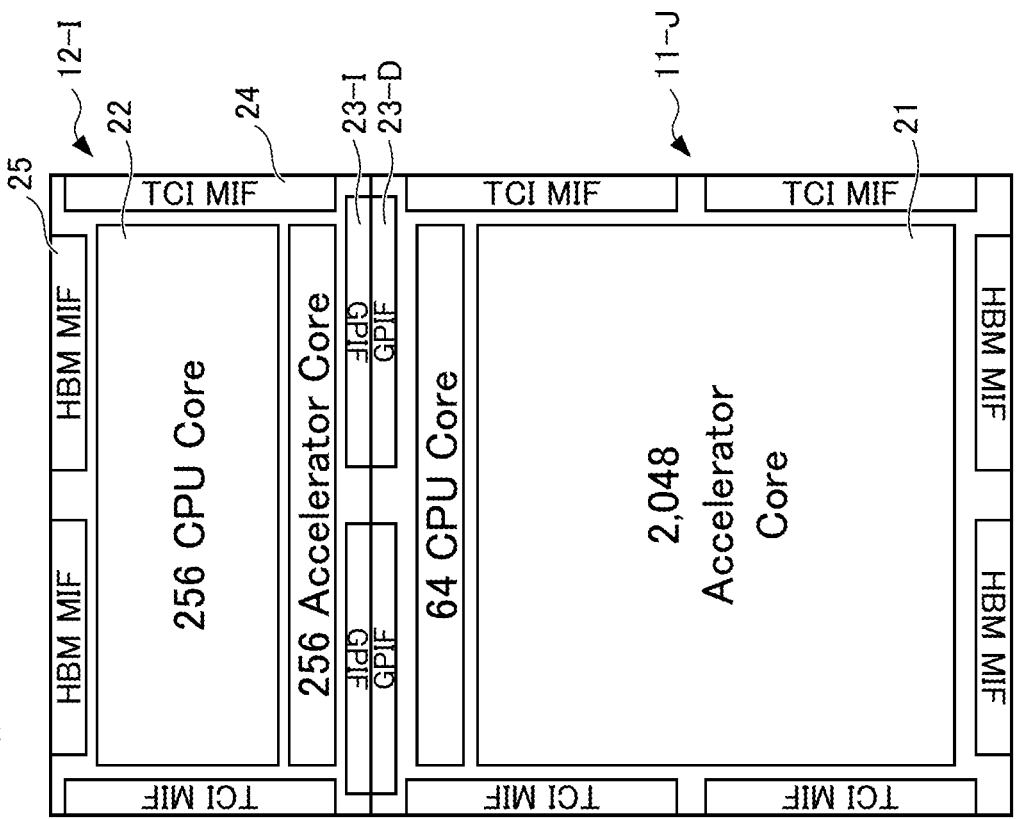

FIGS. 7A and 7B are diagrams showing an example in which different types of dies are mutually connected using the GPIFs In an example of FIG. 7A, a main die 11-J and a sub-die 12-1 are mutually connected using GPIFs 23-J and GPIFs 23-1.

The two GPIFs 23-1 of the sub-die 12-1 are connected to the two GPIFs 23-J of the main die 11-J, respectively.

The number of cores of the CPU core 22 of the main die 11-J is 64 and the number of cores of the accelerator core 21 is 2048.

Both the number of cores of the CPU core 22 and the number of cores of the accelerator core 21 in the sub-die 12-1 are 256.

In other words, a core number ratio between the accelerator core 21 and the CPU core 22 after connection of the main die 11-J and the sub-die 12-1 of FIG. 7A is 2304:320.

In an example of FIG. 7B, a main die 11-L and a sub-die 13-K are mutually connected by GPIFs 23-K and GPIFs 23-L.

The two GPIFs 23-K of the sub-die 13-K are connected to the two GPIFs 23-L of the main die 11-L, respectively.

The number of cores of the CPU core 22 of the main die 11-L is 64 and the number of cores of the accelerator core 21 is 2048.

The number of cores of the CPU core 22 of the sub-die 13-K is 64 and there is no accelerator core 21.

In other words, a core number ratio between the accelerator core 21 and the CPU core 22 after connection of the main die 11-L and the sub-die 13-K of FIG. 7B is 2048:128.

FIG. 8 is a diagram showing an example in which different types of dies having different numbers are mutually connected using the GPIFs 23.

In an example of FIG. 8A, a main die 11-N and two memory interface dies 14-M are mutually connected by GPIFs 23-N and GPIFs 23-M.

The two GPIFs 23-M of the memory interface dies 14-M are connected to the two GPIFs 23-N of the main die 11-N, respectively.

The number of cores of the CPU core 22 of the main die 11-N is 64 and the number of cores of the accelerator core 21 is 2048.

The number of cores of the CPU core 22 of the memory interface die 14-M is 16 and there is no accelerator core 21.

In other words, a core number ratio between the accelerator core 21 and the CPU core 22 after connection of the main die 11-N and the two memory interface dies 14-M of FIG. 8A is 2048:96.

In an example of FIG. 8B, a sub-die 12-R and a sub-die 13-S are mutually connected by GPIFs 23-R and GPIFs 23-S.

The two GPIFs 23-S of the sub-die 13-S are connected to the two GPIFs 23-R of the sub-die 12-R, respectively.

Both the number of cores of the CPU core 22 and the number of cores of the accelerator core 21 in the sub-die 12-R are 256.

The number of cores of the CPU core 22 of the sub-die 13-S is 64 and there is no accelerator core 21.

In other words, a core number ratio between the accelerator core 21 and the CPU core 22 after connection of the sub-die 12-R and the sub-die 13-S of FIG. 8B is 256:320.

In an example of FIG. 8C, a sub-die 12-T and two memory interface dies 14-U are mutually connected by GPIFs 23-T and GPIFs Both the number of cores of the CPU core 22 and the number of cores of the accelerator core 21 in the sub-die 12-T are 256.

The number of cores of the CPU core 22 of the memory interface die 14-U is 16 and there is no accelerator core 21.

In other words, a core number ratio between the accelerator core 21 and the CPU core 22 after connection of the sub-die 12-T and the two memory interface dies 14-U of FIG. 8C is 256:288.

In an example of FIG. 8D, a sub-die 13-P and two memory interface dies 14-Q are mutually connected by GPIFs 23-P and GPIFs 23-Q.

The number of cores of the CPU core 22 of the sub-die 13-P is 64 and there is no accelerator core 21.

The number of cores of the CPU core 22 of the memory interface die 14-Q is 16 and there is no accelerator core 21.

In other words, a core number ratio between the accelerator core 21 and the CPU core 22 after connection of the sub-die 13-P and the two memory interface dies 14-Q of FIG. 8D is 0:96.

There are various types of computers on which packages using the accelerator core 21 and the CPU core 22 are mounted. However, an optimum core number ratio between the accelerator core 21 and the CPU core 22 varies according to the types of computers.

At this time, if the die and the package are manufactured from the beginning according to the optimum core number ratio between the accelerator core 21 and the CPU core 22 different for each type of computers, cost increases and efficiency is low.

Therefore, the plurality of dies are mutually connected using the GPIFs 23 as in this embodiment, so that it is possible to provide packages for core number ratios between the accelerator core 21 and the CPU core 22 appropriate for all computers, without individually manufacturing the packages according to the types of computers.

FIG. 9 is a diagram showing the case where a set of four types of dies is manufactured using one exposure mask 60.

When semiconductors are manufactured, pattern design of circuits is first performed and an examination is made as to how to arrange what sort of circuits efficiently in a small die.

Next, an exposure mask is formed that is necessary when circuit patterns are printed on a surface of a wafer (a thin plate formed by thinly processing a semiconductor material in a disk shape) on the basis of an examination result.

Specifically, the exposure mask 60 shown on the right side of FIG. 9 is formed.

If the exposure mask 60 is formed, exposure is performed via the exposure mask 60 and a pattern of the exposure mask 60 is printed on the surface of the wafer and is developed.

Then, an aluminum metal film for electrode wiring is formed on the surface of the wafer.

By these processes, patterns of many circuits are formed on one wafer.

Specifically, four types of dies shown on the left side of FIG. 9 are formed.

The four types of dies that have been formed are tested for each die and determination of non-defective/defective products is performed.

Normally, when a size of the die increases, a non-defective rate decreases. Therefore, when the size of the die decreases, the yield increases.

Specifically, because the main die 11 has a larger size than the sub-dies 12 to 13 and the memory interface die 14, the non-defective rate is low.

Similarly, because the sub-die 12 has a larger size than the sub-die 13 and the memory interface die 14, the non-defective rate is low.

Similarly, in a relation between the sub-die 13 and the memory interface die 14, the sub-die 13 having a larger size has a lower non-defective rate.

After the determination of non-defective/defective products of the die, the wafer is cut for each die and finishing is checked.

Then, a mounting process for fixing the die not to deviate from a predetermined position of the lead frame and a wire bonding process for connecting the die and the lead frame by bonding wire are performed and the die is packaged with ceramic or molding resin to suppress damage or impacts on the die.

FIG. 9 shows an example of the case where a set of dies is manufactured using the exposure mask 60 having a size of 26 mm×32 mm.

The set of dies is configured to include the main die 11, the sub-die 12, the sub-die 13, and the memory interface die 14.

The four types of dies included in the set of dies are designed to have different sizes for the purpose of making the best use of the exposure mask 60 having a size of 26 mm×32 mm without gaps.

For this reason, four types of dies having different sizes are manufactured individually using one exposure mask. However, as described above, the yields of different types of dies having different sizes are higher in smaller sizes.

Therefore, as shown in FIG. 8A, even if the package in which the two memory interface dies 14-M having a small size are connected to one main die 11 having a large size is formed, the memory interface die 14-M has a higher yield than the main die 11, so that the package is efficiently formed without occurrence of an increase in the inventory of only the main die 11.

Although the embodiment of the present invention is described above, the present invention is not limited to the embodiment described above and modifications, improvements, and the like within the scope of achieving the object of the present invention are included in the present invention.

For example, in the embodiment, the accelerator core 21 and the CPU core 22 are adopted as the cores included in the die, but the present invention is not particularly limited thereto.

That is, the die may include at least one of a first core including the CPU core 22 or the latency core and a second core including the accelerator core 22 or the throughput core.

Here, the first core means a large core for performing complicated operation processing with low latency and a core that manages OS execution, network control/load adjustment, accelerator control/load distribution adjustment, and the like.

Representative examples of the first core include an x86 series general-purpose CPU core mounted in Intel (registered trademark) Core series or Xeon (registered trademark) series.

In addition, the second core means a core taking a small many-core configuration that has large latency, but can obtain a large amount of operation results with high throughput.

Representative examples of the second core include an SIMD core of GPGPU (General-purpose computing on graphics processing units) and an MIMD core of PEZY (registered trademark)-SC (Super Computing).

For example, in the embodiment, there are the four types of dies. However, the present invention is not particularly limited thereto and n types (n is an arbitrary integer value of 1 or more) of dies can be used as a set of dies.

For example, the configurations of the various interfaces and the core number ratio between the accelerator core and the CPU core are merely examples for achieving the object of the present invention and are not particularly limited.

In summary, the package to which the present invention is applied may take the following configuration and various types of embodiments including the above embodiment can be taken.

In addition, the set of dies to which the present invention is applied may take the following configuration and various types of embodiments including the above embodiment can be taken.

That is, the set of dies to which the present invention is applied may be a set of dies that includes at least one of a first core (for example, the CPU core 22 of FIG. 1) including a CPU core or a latency core and a second core (for example, the accelerator core 21 of FIG. 1) including an accelerator core or a throughput core, an external interface (for example, a PCI express), memory interfaces (for example, the TCI/MIF of FIG. 1), and a die interface (for example, the GPIF of FIG. 1) connected to another die, wherein the memory interfaces include at least one memory interface that can connect a memory conforming to a predetermined specification.

As a result, because different types of dies having different sizes can be manufactured using one exposure mask, the gaps generated in the exposure mask can be minimized and the die can be efficiently manufactured.

In the embodiment, the four types of dies having different sizes are manufactured individually using one exposure mask. However, the yields of different types of dies having different sizes are higher in smaller sizes. Therefore, as shown in FIG. 8A, even if the two memory interface dies 14-M having small sizes are connected to one main die 11 having a large size, the memory interface die 14-M has a higher yield than the main die 11, so that a set of dies is efficiently formed without occurrence of an increase in the inventory of only the main die 11.

In addition, independent dies in which the core number ratios between the accelerator core 21 and the CPU core 22 are different and which are mutually connectable can be manufactured using one exposure mask.

As a result, it is possible to provide a set of dies having a core number ratio between the accelerator core 21 and the CPU core 22 appropriate for all computers, without individually manufacturing packages according to the types of computers.

In addition, as shown in FIG. 2, because the TCI DRAM can be connected to the interface conforming to TCI, a set of large dies for high-speed memory communication can be easily manufactured.

In addition, as shown in FIG. 3, because the HBM DRAM can be connected to the interface conforming to RPM, a set of wide-band small dies can be easily manufactured.

In addition, as shown in FIG. 4, because the TCI DRAM and the HBM DRAM can be connected to the interface conforming to TCI and the interface conforming to HBM, respectively, it is possible to easily manufacture a set of dies in which high-speed, large-capacity, and wide-band memory communication that makes the most of the respective characteristics of a plurality of types of memories can be realized.

In addition, as shown in FIG. 5, because the TCI DRAM, the HBM DRAM 40, and the DDR4 DIMM 50 can be connected to the interface conforming to TCI, the interface conforming to HBM, and the memory interface die including the interface conforming to DDR4, respectively, a set of large-capacity large dies can be easily manufactured.

In addition, as shown in FIG. 6, because the same types of dies can be mutually connected by using the GPIFs 23, it is possible to easily manufacture a set of dies to increase the number of cores of the entire package while maintaining the core number ratio between the accelerator core 21 and the CPU core 22.

In addition, as shown in FIG. 7, because different types of dies can be mutually connected by using the GPIFs 23, it is possible to easily manufacture a set of dies to mutually connect different types of independent dies.

Furthermore, as shown in FIG. 8, it is possible to easily manufacture a set of dies for mutually connecting different types of dies having different numbers using the GPIFs 23.

As a result, it is possible to easily manufacture a set of dies to configure a package for core number ratios between the accelerator core 21 and the CPU core 22 appropriate for all computers, without individually manufacturing the packages according to the types of computers.

In addition, the package to which the present invention is applied may be a package including
at least one of a first core (for example, the CPU core 22 of FIG. 1) including a CPU core or a latency core and a second core (for example, the accelerator core 21 of FIG. 1) including an accelerator core or a throughput core,
an external interface (for example, a PCI express),
memory interfaces (for example, the TCI/MIF of FIG. 1), and
a die interface (for example, the GPIF of FIG. 1) connected to another die,
wherein the memory interfaces include at least one memory interface that can connect a memory conforming to a predetermined specification.

As a result, because different types of dies having different sizes can be manufactured using one exposure mask, the gaps generated in the exposure mask can be minimized and the die can be efficiently manufactured.

In the embodiment, the four types of dies having different sizes are manufactured individually using one exposure mask. However, the yields of different types of dies having different sizes are higher in smaller sizes.

Therefore, as shown in FIG. 8A, even if the two memory interface dies 14-M having small sizes are connected to one main die 11 having a large size, the memory interface die 14-M has a higher yield than the main die 11, so that the package is efficiently formed without occurrence of an increase in the inventory of only the main die 11.

In addition, independent dies in which the core number ratios between the accelerator core 21 and the CPU core 22 are different and which are mutually connectable can be manufactured using one exposure mask.

As a result, it is possible to provide a package for core number ratios between the accelerator core 21 and the CPU core 22 appropriate for all computers, without individually manufacturing packages according to the types of computers.

In addition, as shown in FIG. 2, because the TCI DRAM can be connected to the interface conforming to TCI, a large package for high-speed memory communication can be easily manufactured.

In addition, as shown in FIG. 3, because the HBM DRAM can be connected to the interface conforming to HBM, a wide-band small package can be easily manufactured.

In addition, as shown in FIG. 4, because the TCI DRAM and the HBM DRAM can be connected to the interface conforming to TCI and the interface conforming to HBM, respectively, it is possible to easily manufacture a package in which high-speed, large-capacity, and wide-band memory communication that makes the most of the respective characteristics of a plurality of types of memories can be realized.

In addition, as shown in FIG. 5, because the TCI DRAM, the HBM DRAM 40, and the DDR4 DIMM50 can be connected to the interface conforming to TCI, the interface conforming to HBM, and the memory interface die including the interface conforming to DDR4, respectively, a large-capacity large package can be easily manufactured.

In addition, as shown in FIG. 6, because the same types of dies can be mutually connected by using the GPIF 23, it is possible to increase the number of cores of the entire package while maintaining the core number ratio between the accelerator core 21 and the CPU core 22.

In addition, as shown in FIG. 7, because different types of dies can be mutually connected by using the GPIF 23, it is possible to mutually connect different types of independent dies.

Furthermore, as shown in FIG. 8, it is possible to mutually connect different types of dies having different numbers using the GPIF 23.

As a result, it is possible to easily manufacture a package for core number ratios between the accelerator core 21 and the CPU core 22 appropriate for all computers, without individually manufacturing the packages according to the types of computers.

EXPLANATION OF REFERENCE NUMERALS 11, 11-A, B, L, N: main die
12, 12-C, D, I, R, T: sub-die
13, 13-E, F, P, S: sub-die
14, 14-G, H, M, Q, U: memory interface die
21: accelerator core
22: CPU core
23, 23-A to 23-U: GPIF
24: TCI/MIF
25: HBM/MIF
26: DDR4/MIF
30: ICI DRAM
40: HBM DRAM
50: DDR4 DIMM
60: exposure mask
P1: package
P2: package
P3: package
P4: package

The invention claimed is:
1. A set of dies, each die including:
at least one of a first core and a second core, the first core being a CPU or a latency core, and the second core being an accelerator core or a throughput core, and
an external interface,
one or more types of memory interfaces, and
a die interface for connecting to another die,
wherein the set of dies comprises:
a first die comprising at least both the first core and the second core;

a second die comprising at least both the first core and the second core; and one or more third dies comprising one of the first core and the second core, wherein if the interfaces are provided along two adjacent sides of an arbitrary die selected from the set of dies, the interfaces being different interfaces or different types of memory interfaces are arranged on the two adjacent sides, or wherein if instead the interfaces are provided along two opposite sides of an arbitrary die selected from the set of dies, the interfaces being different interfaces or same first type memory interfaces are arranged on the two opposite sides, wherein one of the different interfaces is provided with the die interface, and the other is provided with a second type memory interface.

2. The set of dies according to claim 1,
wherein the one or more types of memory interfaces include an interface conforming to specifications for performing communication in an electrically non-contact manner.

3. The set of dies according to claim 2,
wherein the one or more types of memory interfaces include an interface conforming to TCI.

4. The set of dies according to claim 2,
wherein the one or more types of memory interfaces further include an interface conforming to a three-dimensional stacked next-generation high-speed memory that performs communication in an electrically contact manner.

5. The set of dies according to claim 4,
wherein the one or more types of memory interfaces further include an interface conforming to HBM.

6. The set of dies according to claim 1,
wherein the one or more types of memory interfaces include an interface conforming to a general-purpose memory performing communication in an electrically contact manner and a DIMM (dual inline memory module).

7. The set of dies according to claim 6,
wherein the one or more types of memory interfaces further include an interface conforming to DDR4.

8. A package including at least one die of the set of dies according to claim 1.

9. The package according to claim 8,
further comprising
memories connected to the one or more types of memory interfaces of the at least one die of the set of dies.

10. The package according to claim 9,
wherein the one or more types of memory interfaces include an interface conforming to specifications for performing communication in an electrically non-contact manner.

11. The package according to claim 10,
wherein the one or more types of memory interfaces include an interface conforming to TCI.

12. The package according to claim 10,
wherein the one or more types of memory interfaces further include an interface conforming to a three-dimensional stacked next-generation high-speed memory that performs communication in an electrically contact manner.

13. The package according to claim 12,
wherein the one or more types of memory interfaces further include an interface conforming to HBM.

14. The package according to claim 8,
wherein the package includes at least one die of the first die and the second die,
wherein the package further includes the one or more third dies including memory interfaces conforming to a general-purpose memory performing communication in an electrically contact manner and a DIMM (dual inline memory module), and
the at least one die and the one or more third dies die are mutually connected by the respective die interfaces.

15. The set of dies according to claim 1,
wherein a core number ratio between the first core and the second core is different in each die selected from the set of dies.

* * * * *